United States Patent
Li et al.

(10) Patent No.: US 6,841,094 B2
(45) Date of Patent: Jan. 11, 2005

(54) FINE CONDUCTIVE PARTICLES FOR MAKING ANISOTROPIC CONDUCTIVE ADHESIVE COMPOSITION

(75) Inventors: Hsun-Tien Li, Hsinchu (TW); Shu-Chen Huang, Hsinchu (TW); Kai-Chi Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 320 days.

(21) Appl. No.: 10/246,460

(22) Filed: Sep. 19, 2002

(65) Prior Publication Data

US 2004/0056236 A1 Mar. 25, 2004

(51) Int. Cl.$^7$ ................................................. H01B 1/22
(52) U.S. Cl. ...................... 252/512; 252/514; 428/405
(58) Field of Search ................................ 252/512, 514; 428/405

(56) References Cited

U.S. PATENT DOCUMENTS

| | | | | | |
|---|---|---|---|---|---|
| 4,985,273 | A | * | 1/1991 | Mino | ......................... 427/548 |
| 5,731,120 | A | * | 3/1998 | Tanigami et al. | ........ 430/111.35 |
| 6,492,081 | B2 | * | 12/2002 | Morikawa et al. | ............ 430/66 |

* cited by examiner

*Primary Examiner*—Mark Kopec
(74) *Attorney, Agent, or Firm*—Bacon & Thomas PLLC

(57) ABSTRACT

Fine conductive particles are composed of metallic conductive powder, and an insulating organic capping layer on the grains of the powder. The metallic conductive powder have grains with a diameter ranging from 1 to 20 microns, and the capping layer has a thickness of 50–400 nm, which is able to flow by thermo-pressing. The insulating organic capping layer is prepared from a silane having a reactive functionality, a fluorine-containing silane and a compound or a resin having a functionality able to reactive with the reactive functionality.

24 Claims, No Drawings

FINE CONDUCTIVE PARTICLES FOR MAKING ANISOTROPIC CONDUCTIVE ADHESIVE COMPOSITION

FIELD OF THE INVENTION

The present invention relates to an anisotropic conductive adhesive composition, and particularly to fine conductive particles for making an anisotropic conductive adhesive composition.

BACKGROUND OF THE INVENTION

Along with the development trend towards high density and high performance in the IC industry, a higher density and thinner semiconductor encapsulation technique is also required. Thus, there is an ever increasing demand on the performance and reliability of the encapsulation material. An anisotropic conductive adhesive composition has process features such as easy in processing, high throughput, and high yield, etc. Therefore, the use of an anisotropic conductive adhesive composition in an encapsulation for both the interconnection of IC and hermetic adhesion has become an ever more important selection. An anisotropic conductive adhesive composition mainly uses a control on the particle size and the content of fine conductive particles in combination with a processing technique to make the composition having conspicuous anisotropic properties in the electric conduction direction (thickness direction) and the insulation direction (planar direction). An anisotropic conductive adhesive composition usually comprises a resin as a binder and fine conductive particles. The binder mainly has the functions of preventing the ingress of moisture, adhesion and insulation, etc., and can be a thermoplastic or thermoset resin including a common styrene-butadiene copolymeric resin, a polyacrylate, an epoxy resin, a polyetherimide (PEI), a polyimide (PI), a polyamideimide (PAI), and a polyurethane (PU), etc. Common fine conductive particles include carbon black, metal particles, resin cores coated with a metal, and glass core coated with a metal, etc.

A typical anisotropic conductive adhesive composition is described in U.S. Pat. No. 5,162,087. As shown in FIGS. 2 and 3 therein, when two circuit boards 21 separated by an anisotropic conductive adhesive composition 5 are thermo-compressed, the circuits 20 on the two circuit boards 21 become electrically conductive in the thermo-compressing (thickness) direction, and insulating in the planar direction. This is due to metal-coated particles 3 contained in said anisotropic conductive adhesive composition 5 are clamped by the two circuits 20 and forming contacts, and the rest of the metal-coated particles 3 are dispersed in t he binder 1 and isolated by the binder 1. In order to avoid the occurrence of a short circuit in the planar direction of the circuits, a thin resin layer is formed on the surface of the particle by dry blending the metal-coated particles with a fine resin powder in this U.S. patent. However, the reliability of this dry blending depends on the grain size distribution of the fine resin powder. Furthermore, this thin resin layer is liable to be damaged during the blending process with the binder. Thus, it is difficult for said patent to successfully achieve the objectives of avoiding short circuit in the planar direction and the metal-coated particles being uniformly distributed in the binder.

SUMMARY OF THE INVENTION

One primary objective of the present invention is to provide a thermo-pressing adhesive-type anisotropic conductive adhesive composition, which contains metal conductive particles that can uniformly dispersed in the binder of said anisotropic conductive adhesive composition. Moreover, said anisotropic conductive adhesive composition is electrically conductive in the thermo-compressing direction and not liable to cause a short circuit in the planar direction, when the anisotropic conductive adhesive composition is thermo-compressed.

Another objective of the present invention is to provide a fine conductive particle for making an anisotropic conductive adhesive composition. Said particle has an insulating organic capping layer, which is able to flow by thermo-compressing. Moreover, said capping layer comprises the low surface energy fluoro element and a polymerizable functional group, which has stereo hindrance, a low moisture absorption and low gas permeability.

In order to achieve the abovementioned objectives, a fine conductive particle according to the present invention comprises a metallic conductive powder having grains with a diameter ranging from 1 to 20 microns, and an insulating organic capping layer having a thickness of 50–400 nm on a surface of said grains. Said insulating organic capping layer is prepared by mixing said metallic conductive powder with an alkoxy silane having a reactive functionality and a fluorine-containing alkoxy silane in a solvent to form a fluorine-containing partially hydrolyzed and condensed silane intermediate having a reactive functionality; and to the resulting intermediate adding a polymerizable monomer or a resin having a polymerizable functionality capable of reacting with said reactive functionality, performing a polymerization reaction of said monomer, a reaction of said monomer with said reactive functionality or a reaction of said resin with said reactive functionality. Preferably, an excessive amount of said resin is added to said intermediate so that said insulating organic capping layer thus formed contains a polymerizable functionality of said resin. Said insulating organic capping layer has a low surface energy fluorine element, a stereo hindrance and a polymerizable functionality. An anisotropic conductive adhesive composition prepared by blending the fine conductive particle of the present invention with a binder will have an enhanced reliability, because said stereo hindrance and low surface energy render said fine conductive particle non-agglomerate and anti-sedimentary in the binder, and thus well dispersed in said binder, and because said polymerizable functionality enhances the interfacial adhesion between said fine conductive particle and said binder.

DETAILED DESCRIPTION OF THE INVENTION

The present invention uses the property that silane has a higher affinity to metal than an organic resin has to couple the silane onto the surface of a metallic conductive grain, and uses a reactive functionality contained by the silane to react with a monomer or a resin having a polymerizable functionality, so that an insulating organic capping layer having a thermo-compressing fluidity is formed, thereby obtaining a fine conductive particle. Such a capping layer contains a low surface energy fluorine element and a polymerizable functionality, which has a stereo hindrance, a low moisture absorption and a low gas permeability, so that an anisotropic conductive adhesive composition prepared from the fine conductive particle of the present invention can meet the high density, fine circuiting and high reliability that are required by an advanced IC package. Furthermore, the anisotropic conductive adhesive composition of the present invention can be applied by using the processing facilities and processing steps used by the conventional anisotropic conductive adhesive composition, and thus is comparable to the conventional anisotropic encapsulation in the aspects of continuous production and low material consumption.

Preferred embodiments of the present invention include (but not limited to) the following:

1. A fine conductive particle for making an anisotropic conductive adhesive composition, which comprises:
   a) a metallic conductive grain having a diameter ranging from 1 to 20 microns, the metallic conductive grain being a metal grain or a metal coated grain; and
   b) an insulating organic capping layer on a surface of said metallic conductive grain, said insulating organic capping layer having a thickness of 50–400 nm and being prepared by forming a fluorine-containing intermediate coupled onto the surface of said metallic conductive grain by partial hydrolysis and condensation of silanes; and forming a covalent bond between said intermediate and a resin.

2. The fine conductive particle according to item 1, wherein said intermediate comprises 1–40% by weight of fluorine, based on the weight of said intermediate.

3. The fine conductive particle according to item 1, wherein said covalent bond is —C—C—, —N—C— or —O—C—.

4. The fine conductive particle according to item 3, wherein said —C—C— covalent bond is formed by a reaction of a vinyl group contained in said intermediate and an ethylenic unsaturated monomer forming said resin.

5. The fine conductive particle according to item 3, wherein said —N—C— covalent bond is formed by a reaction of an amino group contained in said intermediate and an epoxide group contained in said resin.

6. The fine conductive particle according to item 3, wherein said —O—C— covalent bond is formed by a reaction of an epoxide group contained in said intermediate and a hydroxyl or carboxyl group contained in said resin.

7. The fine conductive particle according to item 4, wherein said intermediate is formed by partial hydrolysis and condensation of a fluorine-containing alkoxy silane and an alkoxy silane having a vinyl functionality.

8. The fine conductive particle according to item 7, wherein said fluorine-containing alkoxy silane is $C_mF_{2m+1}CH_2CH_2Si(R^1)_n(OR)_{3-n}$ or $(H_5C_2O)_3SiCH_2(CF_2O)_mCH_2Si(R^1)_n(OR)_{3-n}$, wherein m=6–18, n=0 or 1, R and $R^1$ independently are methyl or ethyl; said alkoxy silane having a vinyl functionality is $CH_2=CH_2Si(R^1)_n(OR)_{3-n}$ or $$H_2C=CH-\overset{O}{\overset{\|}{C}}-O-Si(R^1)n(OR)_{3-n}$$

wherein n, R and $R^1$ are defined as above; and said ethylenic unsaturated monomer is selected from the group consisting of ethylene, propylene, styrene, acrylic acid, methacrylic acid, methyl acrylate, and methyl methacrylate.

9. The fine conductive particle according to item 5, wherein said intermediate is formed by partial hydrolysis and condensation of a fluorine-containing alkoxy silane and an amino-containing alkoxy silane.

10. The fine conductive particle according to item 9, wherein said fluorine-containing alkoxy silane is $C_mF_{2m+1}CH_2CH_2Si(R^1)_n(OR)_{3-n}$ or $(H_5C_2O)_3SiCH_2(CF_2O)_mCH_2Si(R^1)_n(OR)_{3-n}$, wherein m=6–18, n=0 or 1, R and $R^1$ independently are methyl or ethyl; said amino-containing alkoxy silane is $XSi(R^1)_n(OR)_{3-n}$, wherein n, R and $R^1$ are defined as above; and X is $NH_2(CH_2)_2NHC_3H_6-$, $NH_2C_3H_6-$ or

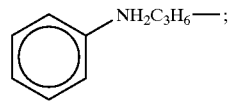

and said resin is an epoxy resin.

11. The fine conductive particle according to item 6, wherein said intermediate is formed by the partial hydrolysis and condensation of a fluorine-containing alkoxy silane and an epoxide-containing alkoxy silane.

12. The fine conductive particle according to item 11, wherein said fluorine-containing alkoxy silane is $C_mF_{2m+1}CH_2CH_2Si(R^1)_n(OR)_{3-n}$ or $(H_5C_2O)_3SiCH_2(CF_2O)_mCH_2Si(R^1)_n(OR)_{3-n}$, wherein m=6–18, n=0 or 1, R and $R^1$ independently are methyl or ethyl; said epoxide-containing alkoxy silane is $XSi(R^1)_n(OR)_{3-n}$, wherein n, R and $R^1$ are defined as above; and X is

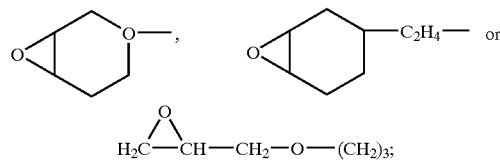

and said resin is a carboxyl terminated butadiene-acrylonitrile copolymer.

13. The fine conductive particle according to item 7, wherein said fluorine-containing alkoxy silane has a number average molecular weight of 500–3000, and said alkoxy silane having a vinyl functionality has a molecular weight of 100–1000.

14. The fine conductive particle according to item 9, wherein said fluorine-containing alkoxy silane has a number average molecular weight of 500–3000, and said amino-containing alkoxy silane has a molecular weight of 100–1000.

15. The fine conductive particle according to item 9, wherein said fluorine-containing alkoxy silane has a number average molecular weight of 500–3000, and said epoxide-containing alkoxy silane has a molecular weight of 100–1000.

16. The fine conductive particle according to item 1, wherein said resin has a weight average molecular weight of 100–10000.

17. The fine conductive particle according to item 16, wherein said resin has a weight average molecular weight of 1000–5000.

18. The fine conductive particle according to item 1, wherein a weight ratio of said intermediate to said resin ranges from 1:20 to 20:1.

19. The fine conductive particle according to item 7, wherein said partial hydrolysis and condensation reaction is carried out in an organic solvent and in the presence of said metallic conductive grain to form a mixture containing said intermediate; and said covalent bond is formed by adding an ethylenic unsaturated monomer into said intermediate mixture to perform a free radical polymerization.

20. The fine conductive particle according to item 9, wherein said partial hydrolysis and condensation reaction is carried out in an organic solvent and in the presence of said metallic conductive grain to form a mixture containing said intermediate; and said covalent bond is formed by adding said resin into said intermediate mixture to perform an epoxide ring-opening reaction.

21. The fine conductive particle according to item 11, wherein said partial hydrolysis and condensation reaction is carried out in an organic solvent and in the presence of said metallic conductive grain to form a mixture containing said intermediate; and said covalent bond is formed by adding said resin into said intermediate mixture to perform an epoxide ring-opening reaction.

22. The fine conductive particle according to item 1, wherein said metallic conductive grain is a metal-coated grain comprising a polymeric nucleus and a metal layer coated on said polymeric nucleus, wherein said metal layer is Au, Ag, Cu, Ni, or a solder.

23. The fine conductive particle according to item 9, wherein said partial hydrolysis and condensation reaction is carried out in an organic solvent and in the presence of said metallic conductive grain to form a mixture containing said intermediate; and said covalent bond is formed by reacting an excessive amount of said resin with said amino-containing alkoxy silane and adding the resulting reaction product to said intermediate mixture to perform an epoxide ring-opening reaction.

24. The fine conductive particle according to item 11, wherein said partial hydrolysis and condensation reaction is carried out in an organic solvent and in the presence of said metallic conductive grain to form a mixture containing said intermediate; and said covalent bond is formed by reacting an excessive amount of said resin with said epoxide-containing alkoxy silane and adding the resulting reaction product to said intermediate mixture to perform an epoxide ring-opening reaction.

The insulating organic capping layer of the fine conductive particle according to the present invention is controlled by chemical synthesis such that its thickness can be accurately controlled at 50–400 nm. Moreover, the fine conductive particle according to the present invention has the following features:

- low surface tension: The insulating organic capping layer of the fine conductive particle has a stereo hindrance, and an element (fluorine) with a low surface energy, so that the fine conductive particles are not easy to agglomerate, thereby enhancing the dispersion property and the anti-sedimentation property of the fine conductive particles in a binder.
- insulating property: The surface of the fine conductive particle has an insulating organic capping layer so as to reduce the possibility of the occurrence of a short circuit in the planar direction due to contact between fine conductive particles, and improve the capability of the anisotropic conductive adhesive composition being used in the package of circuits with a high density.
- low moisture absorption and low gas permeability: The insulating organic capping layer of the fine conductive particle increases the anti-oxidation property of the metallic conductive powder.
- polymerizable functionality: The polymerizable functionality improve the adhesion between the fine conductive particle and the binder, thereby enhancing the reliability of the anisotropic conductive adhesive composition.

The present invention can be better understood by the following examples, which are for illustrative only and not for limiting the scope of the present invention.

EXAMPLE 1

To a 2-liter, three-neck reactor 800 g of ethanol, 25 g of 3-glycidoxypropyl trimethoxysilane (code Z-6040, Dow Corning Co., U.S.A.), 30 g of a fluorine-containing alkoxy silane $(H_5C_2O)_3SiCH_2(CF_2O)_mCH_2Si(OC_2H_5)_3$ (code FLUORO GT S10™, weight average molecular weight (Mw): 1750~1950), 5 g of 1,8-diazabicyclo(5,4,0)-undecene-7 (DBU) octanoic acid salt (code U-CAT SA102, San Apro Co., Japan) were added and the resulting mixture was mixed by agitation. The mixture was added with 1000 g of a nickel- and gold-plated plastic particles (average particle size: 5 microns). The reaction was carried out at 60° C. for one hour under agitation. Then, the mixture was further added with 50 g of a carboxyl terminated polybutadiene-acrylonitrile copolymer (code CTBN 1300× 8, BF Goodrich Co., U.S.A.), and 0.5 g of triethylene diamine, 50 g of N-methyl-2-pyrrolidone (NMP). The reaction was carried out at 80° C. for two hours under agitation. Then, the resulting mixture was filtered and dried at 100° C. (Particle 1)

EXAMPLE 2

To a 2-liter, three-neck reactor 1000 g of ethanol, 10 g of aminoethylaminopropyl trimethoxysilane (code Z-6020, Dow Corning Co., U.S.A.), 20 g of a fluorine-containing alkoxy silane (FLUORO GT S10™), 5 g of DBU octanoic acid salt (U-CAT SA102) were added, and the resulting mixture was mixed by agitation. The mixture was added with 1000 g of silver particles (average particle size: 3.5 $\mu$m). The reaction was carried out at 60° C. for one hour under agitation (part I). To a 0.5-liter, three-neck reactor 15 g of Z-6020, 25 g of a bisphenol A epoxy (code 828, Shell Co., United Kingdom), 0.5 g of $BF_3$-monoethylamine ($BF_3$-MEA), and 50 g of isopropanol were added. The reaction was carried out at 80° C. for two hours under agitation (part II). The part II was added to the part I for reaction at 80° C. under agitation for one hour. The resulting mixture was filtered and dried at 100° C. (Particle 2)

EXAMPLE 3

To a 2-liter, three-neck reactor 800 g of ethanol, 40 g of methacryloxypropyl trimethoxysilane (code Z-6030, Dow Corning Co., U.S.A.), 40 g of a fluorine-containing alkoxy silane (FLUORO GT S10™), and 8 g of DBU octanoic acid salt (U-CAT SA102) were added, and the resulting mixture was mixed by agitation. The mixture was added with 1000 g of nickel particles (average particle size: 5 microns). The reaction was carried out at 60° C. for two hours under agitation. Then, the mixture was further added with 30 g of methacrylate, 0.5 g of 2,2'-azobis-isobutyronitrile (AIBN) (Showa Chemical Co., Japan), and 300 g of NMP. The reaction was carried out at 100° C. for one hour under agitation. Finally, the resulting mixture was filtered and dried at 120° C. (Particle 3).

EXAMPLE 4

Preparation of an Anisotropic Conductive Adhesive Film (ACF-1)

To an 1-liter round bottomed reactor 300 g of an epoxy resin (code HP-4032D, DIC Co., Japan), 150 g of 4,4'-diaminodiphenyl sulfone (DDS), 125 g of Particle 1, 0.2 g of $BF_3$-MEA, 200 g of propylene glycol monomethylether acetate, and 50 g of xylene were added. The mixture was stirred at a high speed by using a high speed mixer for 1–2 hours, and further blended by three-roller miller compounding machine, so that the fine conductive particles were uniformly dispersed in the insulating resin. Finally, the mixture was de-foamed in vacuum while stirring at a low speed to form an adhesive. The adhesive was coated on a PET film by a hot coater to form an anisotropic conductive adhesive tape with an adhesive thickness of 30 μm.

EXAMPLE 5

Preparation of Anisotropic Conductive Adhesive Film (ACF-2)

To an 1-liter round bottomed reactor 400 g of polyamideimide (Mw=150000; solid content=50%, solvent: NMP/xylene=4/1), 200 g of Particle 2, 200 g of NMP, and 50 g of xylene were added. The procedures in Example 4 were repeated to form an anisotropic conductive adhesive tape with an adhesive thickness of 30 μm on a PET film.

EXAMPLE 6

Preparation of Anisotrpic Conductive Adhesive Film (ACF-3)

To an 1-liter round bottomed reactor 400 g of polyetherimide (Mw=100000), 350 g of Particle 3, 0.3 g of 2-ethyl 4-methyl cyanoimidazole, and 500 g of NMP were added. The procedures in Example 4 were repeated to form an anisotropic conductive adhesive tape with an adhesive thickness of 30 μm on a PET film.

Control Example: (Control ACF)

To an 1-liter round bottomed reactor 300 g of an epoxy resin (code HP-4032D), 150 g of 4,4'-DDS, 125 g of a nickel- and gold-plated plastic particles (average particle size: 5 microns), 200 g of PMMA, and 50 g of xylene were added. The procedures in Example 4 were repeated to form an anisotropic conductive adhesive tape with an adhesive thickness of 30 μm on a PET film.

Properties of particles prepared according to the present invention

Thickness of the organic insulating layer on the surface of the particle

| Particle | Thickness of the organic insulating layer (μm) |
|---|---|
| Particle 1 | 150 |
| Particle 2 | 120 |
| Particle 3 | 200 |

Observation on sedimentation of the anisotropic conductive adhesive compostion*1

| Sample | Observation on sedimentation after keeping still for 48 hrs*2 |
|---|---|
| ACF-1 of Example 4 | o |
| ACF-2 of Example 5 | o |
| ACF-3 of Example 6 | o |
| Control ACF of Control Example | x |

*1Prior to the coating in Examples 4–6 and Control Example, the anisotropic conductive adhesive compositions were poured into a glass test tube 2 cm in diameter and 50 cm in height, and kept still for 48 hrs.
*2o: no occurrence of sedimentation; x: occurrence of sedimentation with a height exceeding 1 cm.

Characteristics Tests of the anisotropic conductive adhesive tapes Test carrier

| Pitch (μm) | 80 | 25 |
|---|---|---|
| Bonding Pad (μm$^2$) | 50 × 50 | 15 × 15 |
| Amount of soldering bumps | 200 | 500 |
| Number of test samples | 10 | 10 |

Test results of electrical characteristics

| | Pitch 80 μm | | Pitch 25 μm | |
|---|---|---|---|---|
| | Conduction resistance (Ω) | Insulating resistance (Ω) | Conduction resistance (Ω) | Insulating resistance (Ω) |
| ACF-1 | 0.3 | >10$^8$ | 1.5 | >10$^8$ |
| ACF-2 | 0.4 | >10$^8$ | 1.8 | >10$^8$ |
| ACF-3 | 0.2 | >10$^8$ | 1.1 | >10$^8$ |
| Control ACF | 0.9 | >10$^8$ | 10~100 | short circuit |

Conduction resistance (Ω) before and after of Pressure Cooker Test (PCT)*

| | Pitch 80 μm | | Pitch 25 μm | |
|---|---|---|---|---|
| | Initial value | after PCT | Initial value | after PCT |
| ACF-1 | 0.3 | 4 | 1.5 | 12 |
| ACF-2 | 0.4 | 5 | 1.8 | 17 |
| ACF-3 | 0.2 | 1 | 1.1 | 9 |
| Control ACF | 0.9 | >100 | 10~100 | >1000 |

*PCT conditions are 2 atm, 121° C., 100% relative humidity, and 50 hrs.

What is claimed is:

1. A fine conductive particle for making an anisotropic conductive adhesive composition, which comprises:
   a) a metallic conductive grain having a diameter ranging from 1 to 20 microns, the metallic conductive grain being a metal grain or a metal coated grain; and
   b) an insulating organic capping layer on a surface of said metallic conductive grain, said insulating organic capping layer having a thickness of 50–400 nm and being prepared by forming a fluorine-containing intermediate coupled onto the surface of said metallic conductive grain by partial hydrolysis and condensation of silanes; and forming a covalent bond between said intermediate and a resin.

2. The fine conductive particle as claimed in claim 1, wherein said intermediate comprises 1–40% by weight of fluorine, based on the weight of said intermediate.

3. The fine conductive particle as claimed in claim 1, wherein said covalent bond is —C—C—, —N—C— or —O—C—.

4. The fine conductive particle as claimed in claim 3, wherein said —C—C— covalent bond is formed by a reaction of a vinyl group contained in said intermediate and an ethylenic unsaturated monomer forming said resin.

5. The fine conductive particle as claimed in claim 4, wherein said intermediate is formed by partial hydrolysis and condensation of a fluorine-containing alkoxy silane and an alkoxy silane having a vinyl functionality.

6. The fine conductive particle as claimed in claim 5, wherein said fluorine-containing alkoxy silane is $C_mF_{2m+}$ $_1CH_2CH_2Si(R^1)_n(OR)_{3-n}$ or $(H_5C_2O)_3SiCH_2(CF_2O)_mCH_2Si(R^1)_n(OR)_{3-n}$, wherein m=6–18, n=0 or 1, R and $R^1$ independently are methyl or ethyl; said alkoxy silane having a vinyl functionality is $CH_2=CH_2Si(R^1)_n(OR)_{3-n}$ or

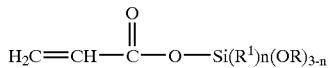

wherein n, R and $R^1$ are defined as above; and said ethylenic unsaturated monomer is selected from the group consisting of ethylene, propylene, styrene, acrylic acid, methacrylic acid, methyl acrylate, and methyl methacrylate.

7. The fine conductive particle as claimed in claim 5, wherein said fluorine-containing alkoxy silane has a number average molecular weight of 500–3000, and said alkoxy silane having a vinyl functionality has a molecular weight of 100–1000.

8. The fine conductive particle as claimed in claim 5, wherein said partial hydrolysis and condensation reaction is carried out in an organic solvent and in the presence of said metallic conductive grain to form a mixture containing said intermediate; and said covalent bond is formed by adding an ethylenic unsaturated monomer into said intermediate mixture to perform a free radical polymerization.

9. The fine conductive particle as claimed in claim 3, wherein said —N—C— covalent bond is formed by a reaction of an amino group contained in said intermediate and an epoxide group contained in said resin.

10. The fine conductive particle as claimed in claim 9, wherein said intermediate is formed by partial hydrolysis and condensation of a fluorine-containing alkoxy silane and an amino-containing alkoxy silane.

11. The fine conductive particle as claimed in claim 10, wherein said fluorine-containing alkoxy silane is $C_mF_{2m+1}CH_2CH_2Si(R^1)_n(OR)_{3-n}$ or $(H_5C_2O)_3SiCH_2(CF_2O)_mCH_2Si(R^1)_n(OR)_{3-n}$, wherein m=6–18, n=0 or 1, R and $R^1$ independently are methyl or ethyl; said amino-containing alkoxy silane is $XSi(R^1)_n(OR)_{3-n}$, wherein n, R and $R^1$ are defined as above; and X is $NH_2(CH_2)_2NHC_3H_6—$, $NH_2C_3H_6—$ or

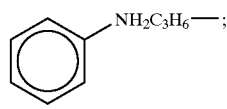

said resin is an epoxy resin.

12. The fine conductive particle as claimed in claim 10, wherein said fluorine-containing alkoxy silane has a number average molecular weight of 500–3000, and said amino-containing alkoxy silane has a molecular weight of 100–1000.

13. The fine conductive particle as claimed in claim 10, wherein said fluorine-containing alkoxy silane has a number average molecular weight of 500–3000, and said epoxide-containing alkoxy silane has a molecular weight of 100–1000.

14. The fine conductive particle as claimed in claim 10, wherein said partial hydrolysis and condensation reaction is carried out in an organic solvent and in the presence of said metallic conductive grain to form a mixture containing said intermediate; and said covalent bond is formed by adding said resin into said intermediate mixture to perform an epoxide ring-opening reaction.

15. The fine conductive particle as claimed in claim 10, wherein said partial hydrolysis and condensation reaction is carried out in an organic solvent and in the presence of said metallic conductive grain to form a mixture containing said intermediate; and said covalent bond is formed by reacting an excessive amount of said resin with said amino-containing alkoxy silane and adding the resulting reaction product to said intermediate mixture to perform an epoxide ring-opening reaction.

16. The fine conductive particle as claimed in claim 3, wherein said —O—C— covalent bond is formed by a reaction of an epoxide group contained in said intermediate and a hydroxyl or carboxyl group contained in said resin.

17. The fine conductive particle as claimed in claim 16, wherein said intermediate is formed by the partial hydrolysis and condensation of a fluorine-containing alkoxy silane and an epoxide-containing alkoxy silane.

18. The fine conductive particle as claimed in claim 17, wherein said fluorine-containing alkoxy silane is $C_mF_{2m+1}CH_2CH_2Si(R^1)_n(OR)_{3-n}$ or $(H_5C_2O)_3SiCH_2(CF_2O)_mCH_2Si(R^1)_n(OR)_{3-n}$, wherein m=6–18, n=0 or 1, R and $R^1$ independently are methyl or ethyl; said epoxide-containing alkoxy silane is $XSi(R^1)_n(OR)_{3-n}$, wherein n, R and $R^1$ are defined as above; and X is

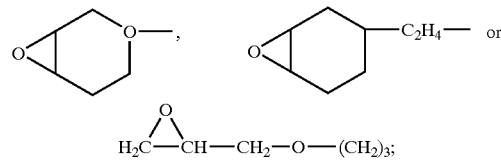

and said resin is a carboxyl terminated butadiene-acrylonitrile copolymer.

19. The fine conductive particle as claimed in claim 17, wherein said partial hydrolysis and condensation reaction is carried out in an organic solvent and in the presence of said metallic conductive grain to form a mixture containing said intermediate; and said covalent bond is formed by adding said resin into said intermediate mixture to perform an epoxide ring-opening reaction.

20. The fine conductive particle as claimed in claim 17, wherein said partial hydrolysis and condensation reaction is carried out in an organic solvent and in the presence of said metallic conductive grain to form a mixture containing said intermediate; and said covalent bond is formed by reacting an excessive amount of said resin with said epoxide-containing alkoxy silane and adding the resulting reaction product to said intermediate mixture to perform an epoxide ring-opening reaction.

21. The fine conductive particle as claimed in claim 1, wherein said resin has a weight average molecular weight of 100–10000.

22. The fine conductive particle as claimed in claim 21, wherein said resin has a weight average molecular weight of 1000–5000.

23. The fine conductive particle as claimed in claim 1, wherein a weight ratio of said intermediate to said resin ranges from 1:20 to 20:1.

24. The fine conductive particle as claimed in claim 1, wherein said metallic conductive grain is a metal-coated grain comprising a polymeric nucleus and a metal layer coated on said polymeric nucleus, wherein said metal layer is Au, Ag, Cu, Ni, or a solder.

* * * * *